(12) United States Patent
Goldberg

(10) Patent No.: US 6,239,878 B1
(45) Date of Patent: May 29, 2001

(54) FOURIER-TRANSFORM AND GLOBAL CONTRAST INTERFEROMETER ALIGNMENT METHODS

(75) Inventor: Kenneth A. Goldberg, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/409,646

(22) Filed: Oct. 1, 1999

(51) Int. Cl.[7] ........................................................ G01B 9/02
(52) U.S. Cl. .......................... 356/520; 356/521; 356/508
(58) Field of Search .................................. 356/508, 511, 356/520, 521

(56) References Cited

U.S. PATENT DOCUMENTS 5,959,730 * 9/1999 Wang et al. .

OTHER PUBLICATIONS

Goldberg, Kenneth A., "Extreme Ultraviolet Interferometry", Ernest Orlando Lawrence Berkeley National Laboratory, pp. 1–275, Dec. 1997, Ph.D. Thesis.
Takaki, Y. et al., "Hybrid holograhic microscopy free of conjugate and zero–order images", Applied Optics, vol. 38, No. 23, 10 Aug. 1999, pp. 4990–4996.

* cited by examiner

Primary Examiner—Robert Kim
(74) Attorney, Agent, or Firm—John P. O'Banion

(57) ABSTRACT

Interferometric methods are presented to facilitate alignment of image-plane components within an interferometer and for the magnified viewing of interferometer masks in situ. Fourier-transforms are performed on intensity patterns that are detected with the interferometer and are used to calculate pseudo-images of the electric field in the image plane of the test optic where the critical alignment of various components is being performed. Fine alignment is aided by the introduction and optimization of a global contrast parameter that is easily calculated from the Fourier-transform.

10 Claims, 6 Drawing Sheets

FOURIER-TRANSFORM AND GLOBAL CONTRAST INTERFEROMETER ALIGNMENT METHODS

STATEMENT REGARDING FEDERALLY SPONSORED RESEARCH OR DEVELOPMENT

The United States Government has rights in this invention pursuant to Contract No. DE-AC03-76SF00098 between the United States Department of Energy and the University of California.

CROSS-REFERENCE TO RELATED APPLICATIONS

Not Applicable

REFERENCE TO A MICROFICHE APPENDIX

Not Applicable

INCORPORATION BY REFERENCE

The following publications which are referred to in this specification using numbers inside square brackets (e.g., [1]) are incorporated herein by reference:
[1] Medecki, H., E. Tejnil, K. A. Goldberg, and J. Bokor, "Phase-shifting point diffraction interferometer," Optics Letters, 21 (19), 1526–28 (1996).
[2] Tejnil, E., K. A. Goldberg, S. H. Lee, H. Medecki, P. J. Batson, P. E. Denham, A. A. MacDowell, J. Bokor, and D. T. Attwood, "At-wavelength interferometry for EUV lithography," Journal of Vacuum Science & Technology B, Nov.-Dec. 1997, 15 (6), pp. 2455–61.
[3] Williamson, D. M., "The elusive diffraction limit," in OSA Proceedings on Extreme Ultraviolet Lithography, Vol. 23, F. Zernike and D. T. Attwood, Eds., Optical Society of America, Washington, D.C., 1994, pp. 68–76.
[4] Naulleau, P., K. Goldberg, S. H. Lee, C. Chang, C. Bresloff, P. Batson, D. Attwood, J. Bokor, "Characterization of the accuracy of EUV phase-shifting point diffraction interferometry," Proc. SPIE, 3331, Santa Clara, Calif., February, 1998, pp. 114–23.
[5] Naulleau, P., and K. A. Goldberg, "Dual-domain point diffraction interferometer," submitted to Applied Optics, Sep. 1, 1998.
[6] Goodman, J. W., Introduction to Fourier Optics, Second ed., McGraw-Hill, New York, 1988.
[7] Goldberg, K., EUV Interferometry, doctoral dissertation, Physics Department, University of California, Berkeley, 1997.
[8] Takeda, M., H. Ina, and S. Kobayashi, "Fourier-transform method of fringe-pattern analysis for computer-based topography and interferometry," J. Opt. Soc. Am., 72 (1), 156–60 (1981).
[9] Nugent, K. A., "Interferogram analysis using an accurate fully automatic algorithm," Applied Optics, 24 (18), 3101–5 (1985).

BACKGROUND OF THE INVENTION

1. Field of the Invention

This invention pertains generally to testing an optical system with an interferometer, and more specifically to methods by which a coherently illuminated optical system can be aligned within an interferometer being used for measuring or inspecting that optical system.

2. Description of the Background Art

Interferometers are often used for taking optical measurements on an optical system. The process of photo-lithography, for example, employs a variety of such optical systems which must be checked for errors and aberrations. In order to accurately perform these tests, it is critical that the components within the optical system be aligned using an interferometer. One form of interferometer is a phase-shifting point-diffraction interferometer (PS/PDI). The PS/PDI [1] generates a spherical reference beam by pinhole diffraction in the image plane of an optical system under test. A PS/PDI is shown in FIG. 1 being used with an optic under test and a CCD detector. A monochromatic beam is diffracted by an entrance pinhole spatial filter and then passed through a coarse grating beamsplitter placed before the image plane on the object-side (or alternately, the image-side) of the optic under test. The beamsplitter generates multiple focused beams that are spatially separated in the image plane. One of the beams from the test optic is allowed to pass through a large window called the test window, within a patterned screen that is herein referred to as a "mask".

The mask used may be either a transmissive mask or a reflective mask. In a transmissive mask the selected area of the test window contains transparent features, such as alignment marks, or may contain a fully transparent window. In a reflective mask, which is often used for EUV radiation, similar features or windows are selectively reflective. Use of the transmissive form of mask element is generally described and depicted herein, as it is easier to visualize and to understand; although either form of mask element may be used within the inventive method. The mask is located in the image plane and the beam passing through the test window is referred to as the test beam.

Any beam so "chosen" by the selective masking contains nearly identical aberration information about the optical system. A second beam from the test optic can be brought to focus on a reference pinhole smaller than the diffraction-limited resolution of the test optic, where it is spatially filtered to become a spherical reference beam covering the numerical aperture of measurement. A controllable phase-shift between the test and reference beams is achieved by a simple lateral translation of the grating beamsplitter. The test and reference beams propagate from the image plane to a detector where the interference pattern is recorded. The detector is positioned to capture the numerical aperture of measurement, and may be used with or without re-imaging optics.

The PS/PDI has been successfully used in the measurement of multilayer-coated, all-reflective extreme ultraviolet (EUV) optical systems, operating near 13-nm wavelength [2], where the fabrication tolerances are in the sub-nanometer regime [3]. Using pinholes on the order of 100-nm diameter, two-mirror optical systems with numerical aperture (NA) of 0.06–0.09 and system wavefront aberration magnitudes on the order of 1-nm rms have been measured. Two-pinhole null tests have recently verified the high accuracy (0.004 waves, or 0.054 nm rms within 0.082 NA) that is attainable with the EUV PS/PDI [4].

During the alignment process, the test window of the mask is normally positioned to be centered on the test beam focus when the reference beam is properly captured and centered on the reference pinhole. The test window width in the direction of beam separation should be less than the beam separation distance to minimize the undesirable overlap of the reference beam through the window. In the EUV application, with a typical beam separation of 4.5 $\mu$m (27 times $\lambda$/NA), the window widths are chosen to be 4.5 $\mu$m or less. An additional constraint may be imposed to achieve the complete separation of the orders in the Fourier domain of the recorded intensity image; here the window width must be limited to two-thirds of the beam-separation distance. [5]

Considering the small pinholes used in the measurement of high-resolution optical systems, alignment is the most challenging aspect of using an interferometer such as the PS/PDI. This fact is compounded in short-wavelength applications where the interferometer exists inside of a vacuum chamber and may be incompatible with other optical alignment strategies. While the test beam is typically easy to align through the large image-plane window, the reference beam should be positioned onto the reference pinhole to within a fraction of the focal spot diameter. The small size required of this pinhole attenuates the reference beam and narrows the "capture range" over which interference fringes are visible. Until the reference pinhole is within the focus of the reference beam, only subtle clues are available to guide the alignment. During fine alignment, once the beam has been captured, the intensity of the test beam remains fixed, and proper positioning can be judged by assessing the point of peak fringe contrast.

BRIEF SUMMARY OF THE INVENTION

The present invention pertains to optical alignment and viewing methods that are based on the use of Fast Fourier-Transforms (FFT) performed on detected images for use with an interferometer for measuring and testing high resolution optical systems. As an alignment tool, the methods provide for rapid alignment wherein the need of high accuracy equipment can in some instances be eliminated. As a pseudo-microscope, the methods provide a simple way in which to perform a magnified inspection of the mask used within the interferometer. The inventive methods are described emphasizing the qualitative description, and several simplifications are made to illustrate the behavior of this method in a number of common configurations.

An object of the invention is to provide a method that simplifies the alignment of a test optic within an interferometer with an optical detector.

Another object of the invention is to provide a method in which the reference beam may be quickly aligned with the reference pinhole prior to beam capture within the pinhole.

Another object of the invention is to provide a faster and more accurate method of fine alignment, wherein a reference beam already captured within a reference pinhole is precisely centered.

Another object of the invention is to provide a method whereby defects in the mask used within an interferometer can be magnified for inspection or measurement.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings for illustrative purposes, the Fourier-transform and global contrast interferometer alignment method of the present invention will be described with reference to FIG. 1 through FIG. 6. It will be appreciated that the apparatus may vary as to configuration and as to details of the parts and that the method may vary as to the specific steps and their sequence without departing from the basic concepts as disclosed herein.

1. Test System Overview

Figure 1:
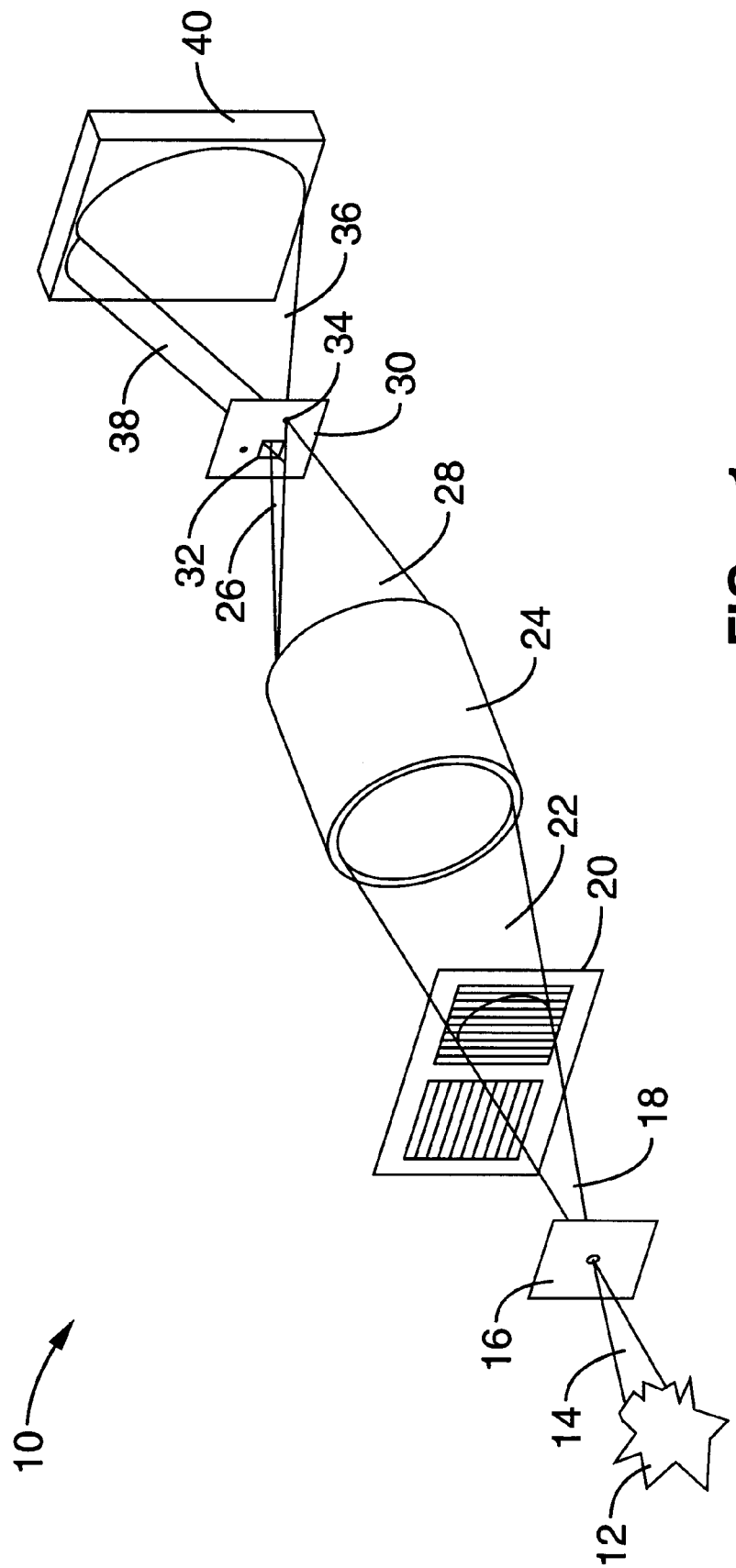
FIG. 1 is a schematic diagram of a PS/PDI interferometer with a test optic upon which the Fourier-transform methods of the present invention are used.

In FIG. 1 a PS/PDI form of interferometer 10 is shown upon which the Fourier-transform and global contrast interferometer alignment method of alignment may be performed. A narrow band, or monochromatic radiation source 12 produces a narrow band of radiation frequencies 14 which are passed through a pinhole diffractor 16, which produces a spherical beam 18 by diffraction. The spherical beam is passed through a coarse-grating beamsplitter 20 that produces multiple focused beams comprising a source test beam 22 onto the test optic 24. The source test beam is transmitted through the test optic 24 which can produce a resultant test beam 26, and a resultant reference beam 28. Both beams converge on a PS/PDI mask 30. The resultant test beam 26, from the test optic 24 is allowed to pass through a large window 32 in an otherwise opaque membrane comprising the PS/PDI mask 30, located in the image plane, while the reference beam is brought to focus on a reference pinhole 34 on the PS/PDI mask. The resultant far-field test beam 38 and far-field reference beam then impinge on a CCD detector 40 where the interference patterns are recorded. The reference pinhole 34 is smaller than the diffraction-limited resolution of the test optic. Transmission through the pinhole spatially filters the reference beam, producing a spherical reference beam that covers the numerical aperture of measurement. A controllable phase-shift between the test and reference beams is achieved by performing a simple lateral translation of the grating beamsplitter. Additional re-imaging optics may be included prior to the detector. The CCD detector 40 is positioned to capture the numerical aperture of measurement.

2. Theory

This section describes the mathematical basis of the alignment method and illustrates, using several examples, the observable behavior of the system during alignment.

Owing to its position in the far-field of the image plane, images recorded by the detector approximate the intensity, or square-modulus, of the Fourier-transform of the field transmitted through the PS/PDI image-plane mask. This transmitted field may be viewed simply as the product of the incident field from the test optic, and the transmission function of the mask. With single-beam coherent illumination, in the absence of the grating beamsplitter, this incident field is the point-spread-function of the test optic. The transmission function of the mask is determined by the pattern of opaque and transparent regions and by the lateral position of the mask in the image plane.

In a single exposure, phase information is temporarily lost and the detector measures only the field intensity. The Auto-correlation Theorem [6] can be applied to the measured intensity to recover information about the field transmitted through the image-plane mask. The transmitted image-plane field is labeled as a $(\rho)$, where $\rho$ is a spatial coordinate vector in the image plane. In the Fraunhofer approximation [6] for the propagation of light, from the image plane to the detector, the measured intensity is related to the Fourier-transform of a $(\rho)$ evaluated at angular frequencies $f=r/\lambda z$ where r is a spatial coordinate in the detector plane, and z is the distance to the detector plane. The detected field is $|A(r)|^2$, where A and a form a Fourier-transform pair. When $|A(r)|^2$ is known, the following relations in two-dimensions hold $$\Im\{|A(\rho)|^2\}=\Im\{A(\rho)A^*(\rho)\}=\int a(\rho')a^*(\rho-\rho')d\rho' \quad (1a)$$

$$\equiv a(\rho)\circ a^*(-\rho). \quad (1b)$$

where $\Im$ signifies the Fourier-transform, and $\circ$ denotes the convolution operator.

2.1 Test Beam Alone

The field transmitted through the mask $a(\rho)$ is the product of the incident field and the mask transmission function $m(\rho)$. Incident on the mask is a focused beam, plus a lower level of scattered light and flare. For demonstration, we may approximate the focused beam as a delta-function, and this light near the focus as having constant magnitude c, much less than unit intensity. $m(\rho)$ includes the large window for the test beam and any light transmitted through the reference pinhole(s). We approximate $a(\rho)$ as:

$$a(\rho)\approx[\delta(\rho)+c]m(\rho-\rho_0). \quad (2)$$

where $\rho_0$ is the lateral displacement of the mask relative to an arbitrary coordinate origin. When the focus of the test beam is unobstructed by the mask window, $a(\rho)$ becomes $$a(\rho)\approx\delta(\rho)+cm(\rho-\rho_0); \quad (3)$$

otherwise, the mask blocks the focused portion of the test beam and $a(\rho)$ contains only $cm(\rho-\rho_0)$. Applying the approximation of Eq. (3) to Eq. (1), we have $$\Im\{|A(r)^2|\}\approx[\delta(\rho)+cm(\rho-\rho_0)]^*[\delta^*(-\rho)+cm^*(\rho_0-\rho)] \quad (4a)$$

$$\approx\delta(\rho)+[cm(\rho-\rho_0)+cm^*(\rho_0-\rho)]+c^2m(\rho)\circ m^*(-\rho). \quad (4b)$$

In this way, the Fourier-transform of the measured intensity is separable into three components: a delta-function peak at the origin; the low-level mask transmission function and its polar-symmetric complex conjugate folded about the point $\rho_0$ and symmetric about the origin; and the auto-correlation of the mask transmission function.

With magnitude proportional to $c^2$, the auto-correlation of m forms a very-low-level background about the central frequencies. The shape and extent of the auto-correlation of m depends on the shape of the window. The auto-correlation reaches a maximum at the central-frequency and decreases to zero at the position that corresponds, respectively, to the width of the window in each direction.

Figure 2:
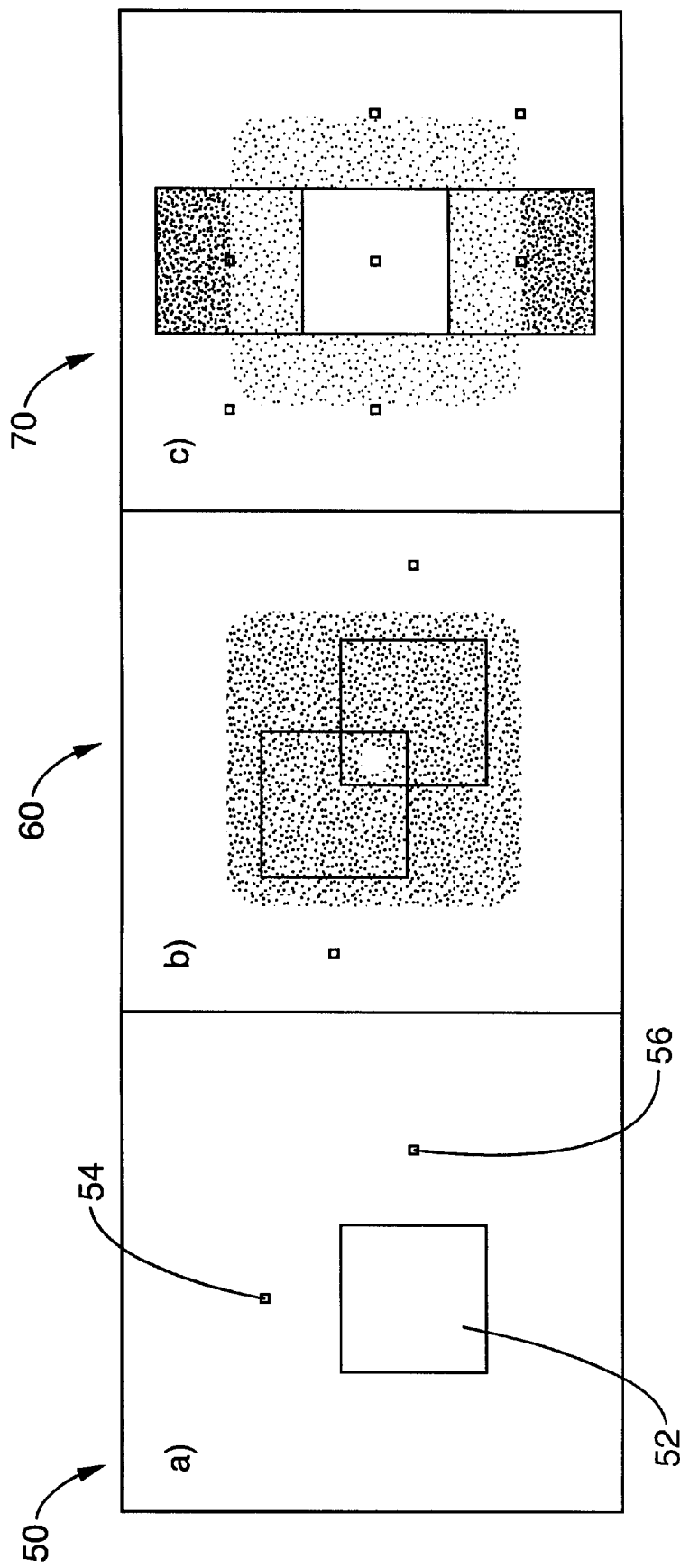
FIG. 2 a diagrammatically depicts transmissive mask pattern and pseudo-images of intermediate and final alignment achieved using the Fourier-transform methods of the present invention.

A PS/PDI mask transmission function 50 is shown in FIG. 2 with a large test window 52 and a vertically displaced reference pinhole 54 and a horizontally displaced reference pinhole 56. To the right of the mask transmission function is shown a simple illustration 60 of the auto-correlation described by Eq. (4). The pseudo-image illustration 60 represents detection as the resultant test beam from the test optic is aligned to pass through the upper-left corner of the test window 52. The pseudo-image 60 shows the magnitude of the Fourier-transform of the detected field, representing the auto-correlation of the image-plane transmitted field.

As the beam, or the mask, is translated laterally the change in $\rho_0$ shifts only the positions of m and m* in the spatial-frequency domain; which is the basis of the Fourier-transform alignment method. By observing the motion of m and m* in the spatial-frequency domain (i.e., in the Fourier-transform of the detected intensity), proper alignment of the test beam in the mask window can be achieved. Proper alignment 70 is illustrated in FIG. 2 with the vertical alignment of the three window images. Owing to the speed of modern computers, this alignment can be performed in near real-time.

This method can also be used as a coarse test of focus, or alternately the longitudinal alignment of the interferometer. When the mask is displaced from the image plane, the apparent size of the focal spot increases, and the delta-function approximation of Eq. (3) must be replaced by a function having a finite width. In practice, this results in a noticeable blurring of the sharp window-edge features in the Fourier-transform of the measured intensity. In the presence of moderate defocus, longitudinal alignment can be performed while the "sharpness" of these features is assessed.

2.2 Test Beam with Reference Beams

When a beamsplitter is used in the PS/PDI, the field from the test optic consists of a pair or a series of displaced copies of its point-spread-function. The description of $a(\rho)$ above can be modified to include the other orders as follows. With a beam separation vector s between adjacent orders, and a series of displaced test beam copies of peak magnitudes given by the coefficients $\{b_j\}$, $a(\rho)$ becomes $$a(\rho)=\left[\sum_j b_j\delta(\rho-js)+c\right]m(\rho-\rho_0). \quad (5)$$

If only one beam is transmitted through the mask window, then the situation will appear identical to Eqs. (3) and (4) with an increased magnitude of c representing the combined flare from multiple beams.

Figure 3:
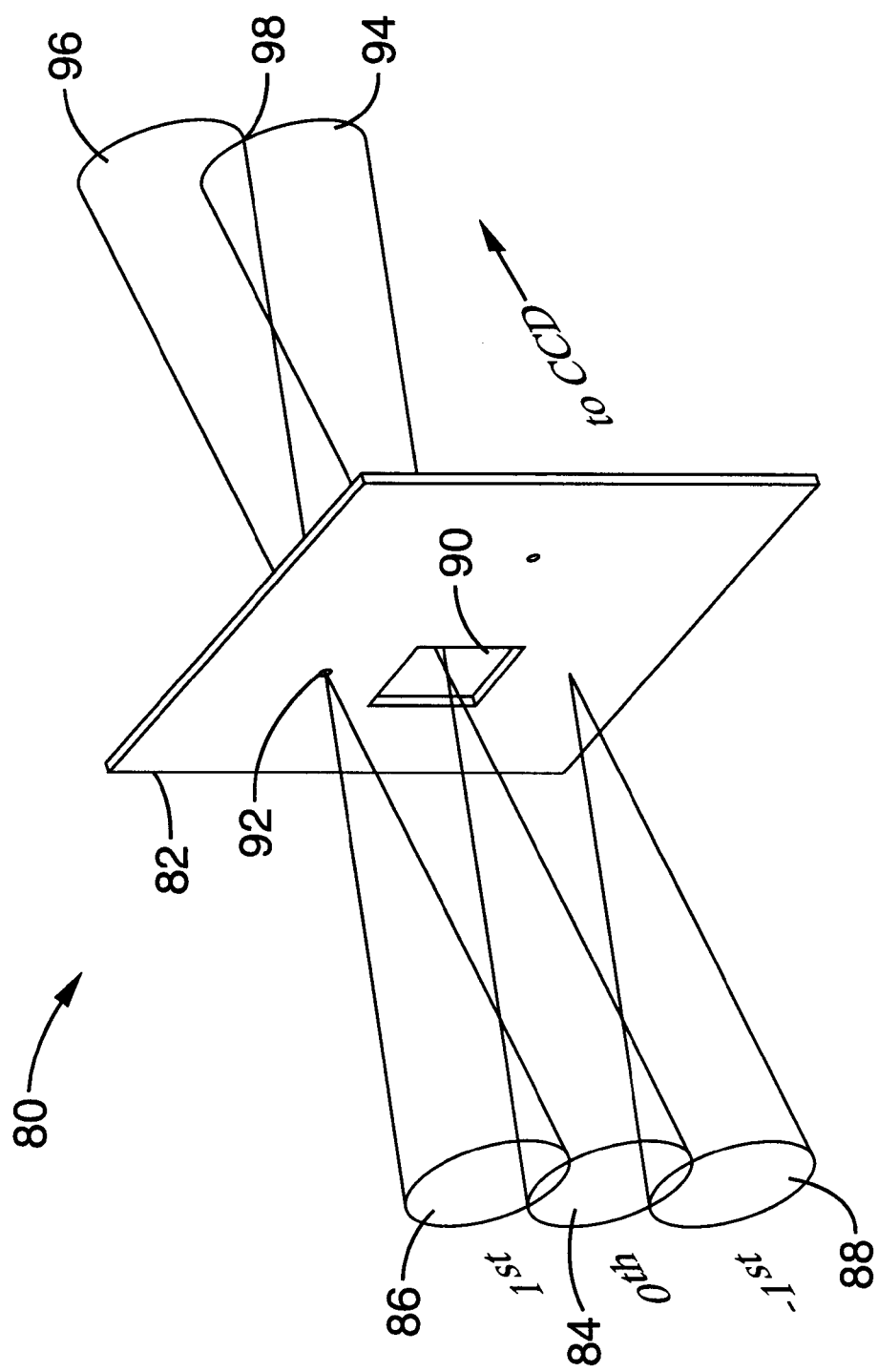
FIG. 3 is a schematic diagram of a transmissive mask in the PS/PDI shown with test and reference beams interacting with the test window and reference pinhole.

When the PS/PDI is properly aligned for interferometry, the test beam passes through the test window as shown by the mask and impinging beam combination 80 of FIG. 3. The mask 82 is shown with a test beam 84 and a pair of reference beams 86, 88 at $1^{st}$ and $-1^{st}$ order. The test beam 84 passes through the test window 90 of the mask 82, while a reference beam 86 ($1^{st}$ order) is transmitted through the reference pinhole 92 which is located at a position displaced by s, from the center focal point of the test window. The other reference beam 88 is blocked by the mask. A resultant test beam 94 and reference beam 96, emerge on the far-field with interference 98. With the addition of the reference beam, interference fringes become visible in the detected intensity. This second beam in the image plane field causes the Fourier-transform of the detected intensity to take a different appearance. In this situation the reference beam in the image plane may be approximated as an additional displaced delta function of relative peak magnitude d.

$$a(\rho)\approx[\delta(\rho)+d\delta(\rho-s)+c]m(\rho-\rho_0) \quad (6a)$$

The small size and spatial filtering of the reference pinhole reduce the reference beam magnitude to a new magnitude d' upon transmission. Now the approximation for the transmitted field in the image plane is $$a(\rho) \approx \delta(\rho) + d'\delta(\rho-s) + cm(\rho-\rho_0). \quad (6b)$$

Relative to Eq. (4) in the single beam case, the auto-correlation of a(ρ) here contains several additional terms.

$$\Im\{|A(r)|^2\} \approx [\delta(\rho) + d'\delta(\rho-s) + d'\delta^*(s-\rho)] + [cm(\rho-\rho_0) + cm^*(\rho_0-\rho) + cd'm(\rho-\rho_0-s) + cd'm^*(s+\rho_0-\rho)] + c^2m(\rho)°m^*(-\rho). \quad (7)$$

There are now three narrow peaks in the Fourier-transform: one at the origin, and two displaced by the beam separation vector ±s, representing the reference beam and its complex conjugate. In addition to the two overlapped, polar-opposite mask patterns at the origin, m(ρ) is repeated at s and –s. This situation of proper alignment 70 is illustrated in FIG. 2 with the vertical alignment of the three window images. There is a relative magnitude difference of d' between the central and the displaced patterns due to the intensity difference of the test and reference beams. The background auto-correlation of m(ρ) is still present in the same form as before.

Since these additional components of the Fourier-transform appear only when the reference beam is aligned to pass through the reference pinhole, their presence indicates that the PS/PDI is aligned for interferometric measurements. An additional fine alignment merit-function, called Global Image Contrast, is described in Section 4.

2.3 Reference Beam Alone

A final case for consideration is that of the reference beam alone. When a single beam passes through the reference pinhole and only scattered light is transmitted through the adjacent window, the situation can be approximated as $$a(\rho) \approx [d\delta(\rho) + c]m(\rho-s) \quad (8a)$$

$$\approx d'\delta(\rho) + cm(\rho-s) \quad (8b)$$

where s, the beam-separation vector, is by design also the distance between the reference pinhole and the center of the window. In this case, the detected intensity contains the broad pinhole diffraction pattern, and the high-frequency components of the reference beam that "leak" through the window. As above, the auto-correlation of a(ρ) contains only three terms: a delta-function at the zero-frequency position, two polar-symmetric displaced copies of the mask transmission function, and the low-level auto-correlation of the mask.

$$\Im\{|A(r)|^2\} \approx d'\delta(\rho) + [d'cm(\rho-s) + d'cm^*(s-\rho)] + c^2m(\rho)°m^*(-\rho) \quad (9)$$

This case allows the investigation of the quality of the pinhole diffraction that produces the reference wavefront and of the high-spatial-frequency content of the isolated reference beam. As will be shown below, it is also a good way to study the characteristics of the test beam window in situ.

2.4 Measuring Distances in the Fourier-domain

The capacity of this technique to reveal the features of the image-plane mask in the Fourier-domain analysis warrants a brief discussion of the relationship between the spatial-frequencies and actual units of measurement. By considering the simple interference pattern generated by two spherical waves originating from displaced point-sources in the image plane, a simple relation is derived.

Considering a given optical system having a numerical aperture, NA, the cone of light subtending the full angular range will intersect the detector over an area $n_{NA}$ pixels in diameter, where the full diameter of the detector is $n_d$ ($>n_{NA}$) pixels. ($n_d$ may be either the full size of the detector array or an appropriate sub-region that is used in the Fourier-transform calculation). In the two-wave example, a point separation of λ/(2 NA) generates one wave of path-length difference, or one fringe across the detected area ($n_{NA}$ pixels). Therefore, a separation of $(n_{NA}/n_d)\lambda/(2 \text{ NA})$ generates one fringe across the $n_d$ pixels of measurement and would appear in the Fourier domain as two symmetric delta-function peaks separated by a distance of two cycles. This result can be cast in a more convenient form. In the Fourier-transform, the scaling of the pseudo-image is:

$$\frac{\lambda[\mu m]}{4NA} \cdot \frac{n_{NA}}{n_d} (\mu m/\text{cycle}). \quad (10)$$

To demonstrate the scaling factor described by Eq. (10), consider the EUV PS/PDI operating at 13.4-nm wavelength, measuring a system of 0.08 NA. In this system the full angular range typically subtends 80% of the available detector width: the ratio $n_{NA}/n_d$ equals 0.8. This scaling factor of 0.033 μm per cycle (or equivalently, 0.033 μm per pixel in the FFT pseudo-image), indicates a Fourier-domain separation of approximately 30 cycles per micron of real-space distance. Therefore image-plane windows about 4.5-microns wide appear in the Fourier-transform as approximately 134cycles across. Features in the Fourier-transform are resolvable as small as two cycles wide, which corresponds to 0.067 micron mask features. In practice, however, the finite width of the reference beam's Fourier-transform reduces this resolution slightly.

3. Experimental Demonstration Images

Figure 4:
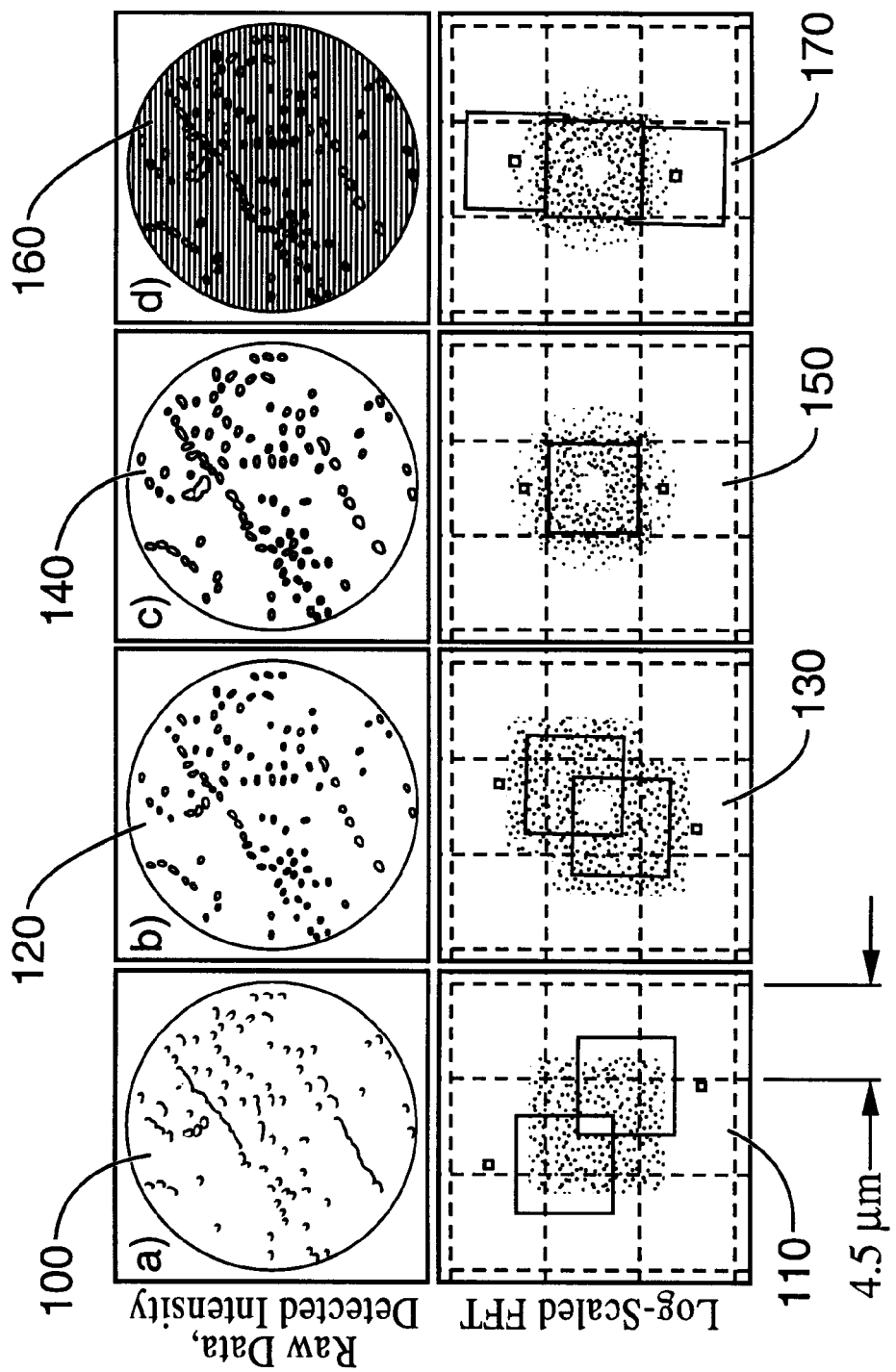
FIG. 4 diagrammatically depicts images of detected intensity from the test optic with corresponding pseudo-images achieved using the Fourier-transform methods of the present invention.

Several characteristic images from the alignment of the EUV PS/PDI are diagrammatically depicted in FIG. 4, along with a detailed image of the central portion of the logarithmically-scaled Fourier-transform magnitude for each. The optical system under test is a molybdenum/silicon multilayer-coated Schwarzschild objective operating with 0.07 NA (numerical aperture) at 13.4-nm wavelength [2]. The transmitted intensity reveals small defects in the multilayer-coatings that are not important in this discussion. The PS/PDI mask window is a 4.5 μm wide square.

There are two reference pinholes, located 4.5 μm from the center of the window, 90-degrees apart.

The situation depicted by the first two pairs of images 100, 110 and 120, 130 in FIG. 4 is represented by Eq. (4), with the strong peak at the origin of the spatial-frequency spectrum, the two displaced and polar-symmetric mask transmission functions, and the low-level background centered about the zero-frequency are apparent. The shape, position, and orientation of the mask window relative to the test beam focus are clearly visible.

As alignment proceeds as shown in images 140 and 150 in FIG. 4, the test beam is nearly centered in the window as shown in image 150. The Fourier-transform contains the mask transmission function strongly overlapping a polar-symmetric copy of itself. When the system is brought into final alignment as shown in images 160 and 170, the reference beam comes through the reference pinhole and the situation is characterized by the description of Eq. (7). Three delta functions are visible at final alignment in image 170, with one at the origin plus a pair of images at the beam separation positions ±s. As before, the window and its polar-symmetric reflection overlap across the origin, yet now, as described by Eq. 7(b), additional, fainter copies centered about ±s are visible. Note, however, that the raw-images at each stage do not provide adequate visual clues for performing the alignment.

Figure 5:
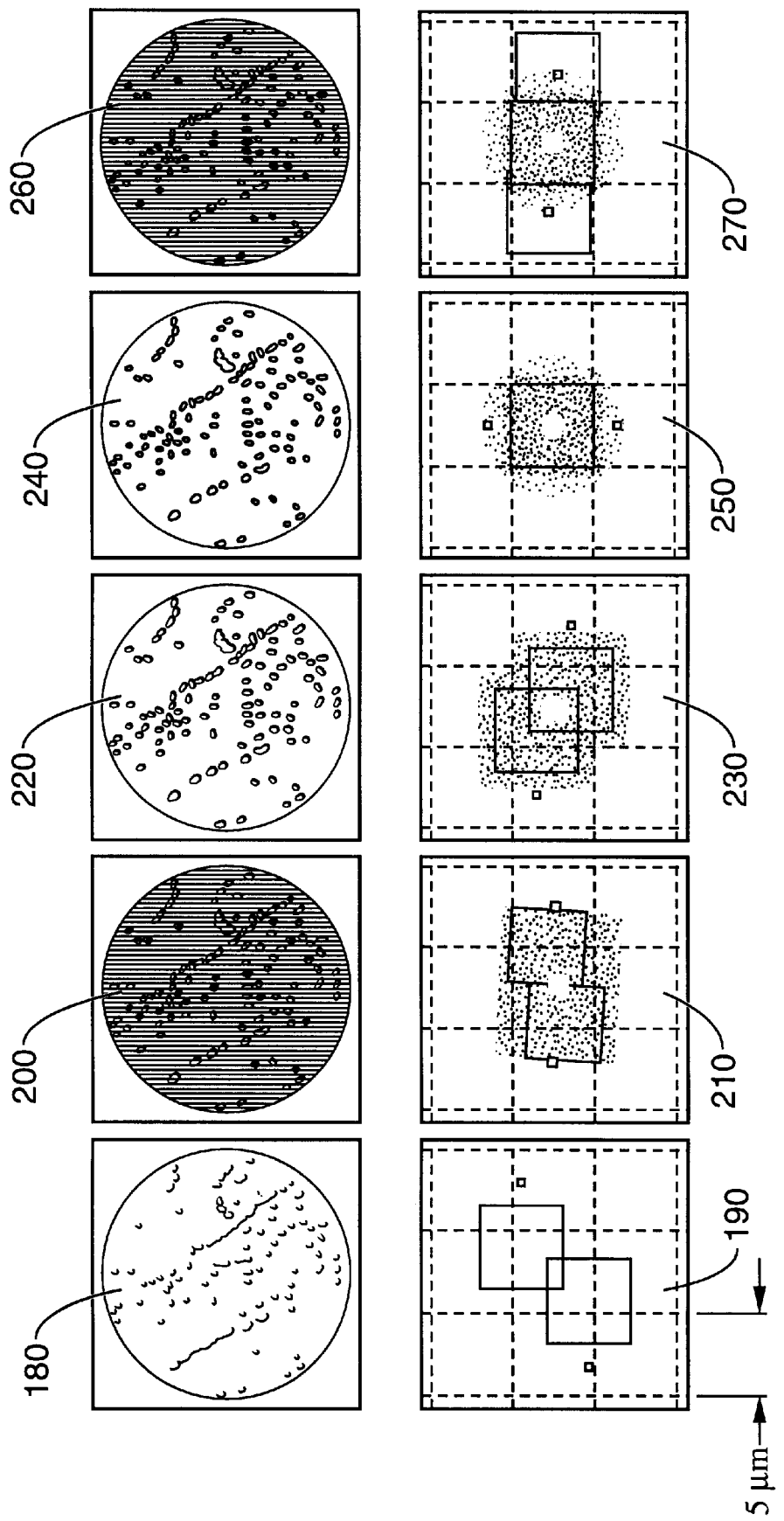
FIG. 5 diagrammatically depicts a set of corresponding images and pseudo-images in which the beamsplitter of FIG. 4 has been rotated 90°.

FIG. 5 diagrammatically depicts a set of 5 similar pairs of images with associated pseudo-images. These image were arrived at by altering the orientation of the beamsplitter grating.

Figure 6:
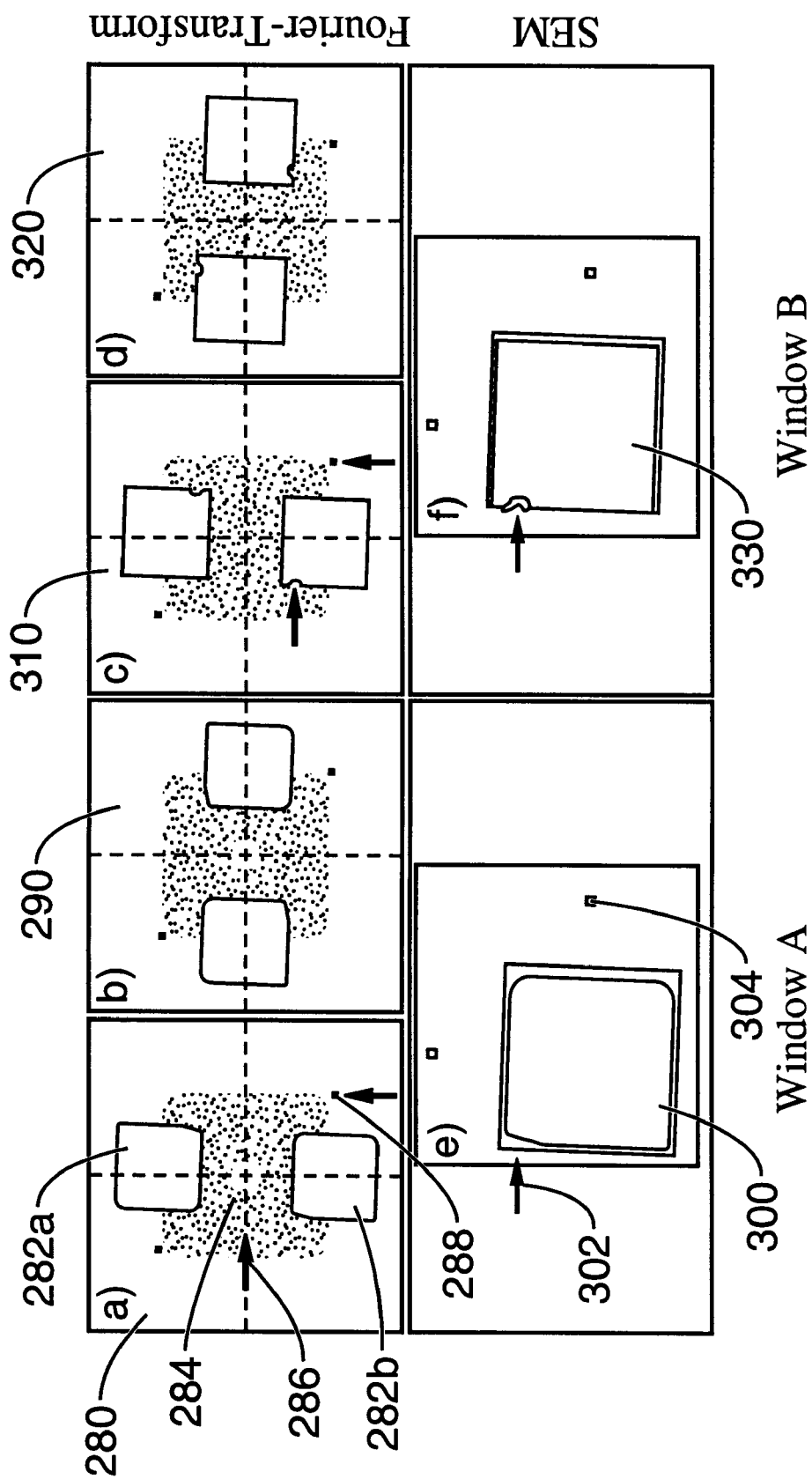
FIG. 6 diagrammatically compares pseudo-images achieved using the Fourier-transform methods of the present invention and images of the same pair of masks created by a scanning electron microscope.

FIG. 6 represents the situation described in Section 2.3 in which only the reference beam is present. Images of the logarithmically-scaled magnitude of the Fourier-transform for two different mask test windows are diagrammatically depicted, each window having two adjacent reference pinholes. A vertical and a horizontal orientation pseudo-image are shown for each mask window. The orientation follows the beam-separation direction, which is set by the orientation of the grating beamsplitter within the interferometer. Easily visible in the image 280 is the shape of the mask window (as seen in the identical pair of displaced images 282a, 282b), the delta function peak at the origin 284, the low-level auto-correlation of the mask transmission function 286, and even the positions of the pinhole 288 that is not at the center of the reference beam focus. A representation of a scanning electron-microscope (SEM) image 300 is shown below the corresponding pseudo-images 280, 290 of the same window. Clearly visible in image 300 are the corresponding upper left corner mask defect (which corresponds to the same feature seen in the displaced image 282b), and the pinhole location 304 that is not at the center of the reference beam focus.

Another set of logarithmically-scaled pseudo-images 310, 320 for a different PS/PDI mask is displayed to the right of the previous images. Again a corresponding representation of a SEM image 330 is shown below the pseudo-images. Small features in the mask can be seen again in both the pseudo-images and the SEM image.

It should be noted that errors made in performing the subtraction of offset-signals, or background images can cause spurious artifacts to appear in the central frequency portions of the Fourier-transformed image. These spurious features show up as non-zero "stripes" along the x- or y-axes and are visible in many of the pseudo-images of FIG. 4 through FIG. 6. Offset calibration is often necessary for images recorded with a CCD, or similar detector, so that the intensity is accurately described. With proper calibration, the detector provides a high-quality Fourier-transform "image". The presence of these spurious artifacts has no appreciable effect on the results, and poses little more than a distraction.

The correspondence between the pseudo-images and the representation of the SEM images illustrates the power of using pseudo-images as a "microscope". The PS/PDI can be used in this manner to create Fourier-transform images of the field in the image plane with no additional components and no additional cost.

This important property enables this technique to serve a second role. Since the properties of the field at the image plane can be investigated, through holographic reconstruction, the technique can be used to probe other optical performance properties of a system under test, or as a way to identify patterned features designed as alignment aids.

4. Alignment by Global Image Contrast

When the PS/PDI is nearly aligned, and the interference of the test and reference beams is visible, fine adjustment of the components can be performed to optimize the appearance of the fringes across the measurement domain. The merit function of primary interest is the interference fringe contrast; maximizing the fringe contrast directly improves the signal-to-noise ratio in the measurement [7] and will yield the highest reference-wave quality.

The calculations required by the Fourier-transform alignment method lend themselves to the definition of a rapidly-calculable global fringe contrast parameter, $\Gamma$, that can be used in alignment. As used herein, $\Gamma$ is defined as the ratio of the power in the reference beam to the power of the test beam, determined by investigation of the Fourier-transform of the detected intensity. During alignment, it is not necessary to calculate $\Gamma$ with accuracy or high precision, as long as a consistent method of calculation is followed: most cases of interest the position of maximum contrast will coincide with the maximum $\Gamma$.

This method is applicable to any interferometric measurement that requires the optimization of fringe contrast in the presence of a spatial carrier-frequency. One fundamental prerequisite for the application of this method is the separability of the first-order peak from the zeroth-order in the spatial-frequency domain. This property, which is a standard requirement of the Fourier-transform method of interferogram analysis [8, 9], is guaranteed in the PS/PDI because of the necessary separation of the test and reference beams in the image plane. In other circumstances, the addition of a spatial carrier frequency may be required, for which the magnitude of the spatial carrier frequency will depend on the quality of the optical system under test.

To describe the application of this method, we begin with an arbitrary interferogram where the measured intensity I(r) is represented as:

$$I(r) = A(r) + B(r) \cos[\phi(r) - k_0 \cdot r], \text{ with A,B,} \phi \text{ real numbers,} \quad (11)$$

where r is a coordinate in the plane of measurement, and $k_0$ is the spatial carrier-frequency. The local fringe contrast is defined as the ratio $B(r)/A(r)$, bounded on $[0, 1]$. Following the description typically used in the Fourier-transform method of interferogram analysis, it is useful to employ the simplification that A and B contain only low-spatial-frequency components. To facilitate the Fourier-domain representation of the interferogram, the cosine is separated as follows:

$$I(r) = A(r) + C(r)e^{ik_0 \cdot r} + C^*(r)e^{-ik_0 \cdot r}, \quad (12)$$

where $$C(r) \equiv 1/2 B(r) e^{i\phi(r)}. \quad (13)$$

By inspection, the Fourier-transform of the interferogram may be written $$i(k) = a(k) + c(k - k_0) + c^*(k + k_0), \quad (14)$$

where A and a, and C and c are Fourier-transform pairs. By assumption, with primarily low-spatial-frequency content in a and c, they are both strongly peaked at zero-frequency. The Fourier-transform in Eq. (14) thus contains three distinct peaks: one at zero-frequency, and two displaced by the spatial carrier-frequency, located at $+k_0$ and $-k_0$.

The definition of the global parameter $\Gamma$, based on single-interferogram analysis, serves in the assessment of the interferometer's instantaneous alignment. Here we define $\Gamma$ as $$\Gamma \equiv \sqrt{\overline{B^2}/\overline{A^2}}. \quad (15)$$

where $\Gamma$ is defined by the root-mean-square magnitudes of B and A across a sub-domain of the interferogram measurement. It is so defined because these quantities are readily calculable from the FFT of the whole interferogram, or from an appropriate sub-domain of the interferogram. With s as the area of the sub-domain, $\overline{A^2}$ and $\overline{B^2}$ are defined in the spatial domain as $$\overline{A^2} = \frac{1}{s} \int |A(r)|^2 \, dr \qquad (16a)$$

and $$\overline{B^2} = \frac{1}{s} \int |B(r)|^2 \, dr = \frac{4}{s} \int |C(r)|^2 \, dr \qquad (16b)$$

where the substitution of Eq. (13) into the definition has been made in Eq. (16b).

By Parseval's Theorem, the total energy content of the spatial domain and the spatial-frequency domain are equivalent [6]. Hence, $$\overline{A^2} = \frac{1}{s} \int |a(k)|^2 \, dk, \qquad (17a)$$

and $$\overline{B^2} = \frac{4}{s} \int |c(k)|^2 \, dk \qquad (17b)$$

Since by assumption both a(k) and c(k) are strongly localized about the central-frequency, the full integrals of Eqs. (17a) and (17b) may be approximated by the integral over a small region of radius κ, centered in the spatial-frequency domain.

$$\overline{A^2} \approx \frac{1}{s} \int_{|k|<\kappa} |a(k)|^2 \, dk \qquad (18a)$$

and $$\overline{B^2} \approx \frac{4}{s} \int_{|k|<\kappa} |c(k)|^2 \, dk = \frac{4}{s} \int_{|k-k_0|<\kappa} |c(k-k_0)|^2 \, dk \qquad (18b)$$

In order to match the form of c(k) in Eq. (14), the integration of $|c(k)|^2$ in Eq. (18b) has been shifted by the spatial carrier-frequency. The separation of the three terms in Eq. (14) allows one final substitution.

$$\overline{A^2} \approx \frac{1}{s} \int_{|k|<\kappa} |i(k)|^2 \, dk \qquad (19a)$$

and $$\overline{B^2} \approx \int_{|k-k_0|<\kappa} |i(k)|^2 \, dk \qquad (19b)$$

Thus, $\overline{A^2}$ and $\overline{B^2}$ are calculated from separate regions of the same Fourier-transform. Using Eqs. (19a) and (19b) yields a complete expression for:

$$\Gamma = 2 \sqrt{\frac{\int_{|k-k_0|<\kappa} |i(k)|^2 \, dk}{\int_{|k|<\kappa} |i(k)|^2 \, dk}} \qquad (20)$$

When the spatial carrier-frequency $k_0$ is not known in advance, it is easily determined by locating one of the two symmetric points of peak magnitude in the FFT, outside of an excluded region that contains the central frequency. It is not necessary to determine $k_0$ accurately when the integration radius κ is several cycles in magnitude. However, when $k_0$ is known accurately, a more simple approximation for $\Gamma$ can be used, based on the values of i(k) at two points.

$$\Gamma \approx 2 \left| \frac{i(k_0)}{i(0)} \right|. \qquad (21)$$

Similar to the Fourier-transform method of interferogram analysis, the zeroth- and first-order peaks have been isolated from the rest of the spectrum. The quantity of interest here, however, is the energy content within a spatial-frequency radius κ.

Eqs. (20) and (21) are easily implemented on a computer using the standard mathematical Fast Fourier-transform. Depending on the combined characteristics of the illuminating beam and the test optical system, the radius, κ, must be chosen large enough to encircle most of the zeroth-or first-order components in the spatial-frequency domain, yet small enough to avoid overlap.

Different values of κ may be chosen for the two integrations, as appropriate. Typically, these radii must not be larger than half of the "distance" between the first-order peak and the central frequency. A radius of ten cycles was chosen for these EUV interferometry experiments in which more than forty fringes are typically present across the measurement NA. In practice, evaluation of the alignment position that produces the maximum value of $\Gamma$ is not sensitive to the definition of κ. Furthermore, the integration regions need not be circular.

To increase the calculation speed, a sub-domain of the interferogram (such as a central portion, a narrow ribbon of data, or even a single column through the center) may be used in the contrast calculations.

5. Example IDL Program

One program that has been used for performing and displaying the pseudo-images is shown below. The program is written in IDL (Interactive Data Language, by Research Systems Inc.).

```
;----------------------------------------
; IDL Procedure — showimage.pro
;----------------------------------------
pro showimage, name, p=p
    if not defined(name) then name ='~frnguser/image.spe'
    s = 180
    n = !d.n_colors
    rr = [lingen(255, n-2), 230]
    gg = [lingen(255, n-2), 0]
    bb = gg
    tvlct, rr, gg, bb
    a = kload(name)
    sz = width(a)
    q = alog(abs(shift(fft(a,1), sz/2, sz/2)))>(-3)
    q2 = congrid(nest(q, s), 360, 360) < 15
    wset, 0
    p = bytscl(q2, top=n-3)
    tv, p
end
```

During alignment, an image is recorded and saved to the disk as "image.spe" in this original application of the alignment method. This file is overwritten many times during the alignment process. From the IDL command-line interface, the user runs the program. The scaled Fast-Fourier-Transformn (FFT) pseudo-image appears in a graphics window, revealing the intermediate alignment position. Those skilled in the art will appreciate that, instead of saving the images to disk, the images could be viewed in real time without any effect on the results. Saving of images to disk or viewing images in real time does not form a part of the invention. In the event that real time viewing of images is desirable, various interfaces and analytical tools can be used, including the graphical user interface for image acquisition and processing described in my co-pending application Ser. No. 09/181,036 filed on Oct. 27, 1998 and incorporated herein by reference as background information.

6. Additional Applications

In addition to the uses previously described, the method may be used for additional applications which include the alignment of image-plane apertures in general optical systems, the rapid identification of patterned image-plane alignment marks, and the probing of important image-plane characteristics of an optical system.

7. Summary

The Fourier-transform alignment method has proven itself to be an invaluable tool in the rapid alignment of any interferometer, of which an EUV PS/PDI is but one example. The methods are applicable to a variety of circumstances where the alignment of components in the image plane of a coherently illuminated optical system is required. Using a relatively fast microprocessor, the logarithmically-scaled magnitude of the Fast Fourier-transform of the recorded intensity may be displayed alongside of the raw image in near real-time. This provides a powerful and convenient mode of alignment feedback.

In addition, this method provides a high-resolution pseudo-image of the image-plane field and optical components, that may be employed as a "microscope" for the optics and mask system.

Additionally a global fringe contrast parameter may be calculated from the Fourier-transform data to judge the optimum fine-alignment of the PS/PDI or any interferometer in which the Fourier-transform methods of single-interferogram analysis are applicable.

Those skilled in the art will appreciate that the method of the invention would normally be practiced with the assistance of any conventional computer system under processor control. Additionally, it will be understood that any operable software or code for implementing the present invention on such computer system can be easily developed using conventional programming techniques.

Accordingly, it will be seen that the current invention, Fourier-transform and global contrast interferometer alignment method, can be implemented with numerous variations obvious to those skilled in the art. Although the description above contains many specificities, these should not be construed as limiting the scope of the invention, but as merely providing illustrations of some of the presently preferred embodiments of this invention. Thus the scope of this invention should be determined by the appended claims and their legal equivalents.

What is claimed is:

1. An alignment method wherein an interferometer is used to reduce alignment error between an optical system and an image plane, comprising the steps of:

(a) illuminating the optical system to produce resultant beams which strike the image plane of an interferometer mask;

(b) selectively masking the resultant beams;

(c) recording beam intensity images for the resultant beams that are transmitted through the selective mask; and (d) calculating logarithmically-scaled magnitudes for the Fast Fourier-transforms which are computed from the beam intensity images to thereby produce alignment information.

2. A method as recited in claim 1, further comprising the steps of moving at least one optical component to alter the position wherein at least one resultant beam strikes the image plane mask, said move being made substantially according to said alignment error information whereby an effective reduction in alignment error is thereby produced.

3. A method as recited in claim 1, wherein said interferometer comprises a phase-shifting point-diffraction interferometer.

4. A method as recited in claim 1, wherein said step of recording beam intensity images comprises the steps of:

(a) impinging wavefronts from at least one beam onto the surface of a CCD imager; and (b) periodically capturing signals generated by the CCD.

5. A method as recited in claim 1, wherein the resultant beams are selectively masked by passing a test beam through a test window in the interferometer mask and additionally passing at least one reference beam through at least one reference pinhole in said interferometer mask.

6. A method as recited in claim 1, wherein said step of calculating logarithmically-scaled magnitudes for the Fast Fourier-transforms is performed in near real time.

7. A method as recited in claim 1, wherein said step of illuminating the optical system is performed by transmitting radiation from a source through an object pinhole followed by spatial separation of the beam by a beamsplitter.

8. A method as recited in claim 1, wherein the alignment information is displayed in the form of a pseudo-image computed from the logarithmically-scaled magnitudes for the Fast Fourier-transforms of the intensity impinging on the imager, which is used in said moving of at least one optical component according to said alignment information.

9. An alignment method wherein a interferometer is used to reduce alignment error between a mask and an optical system's image plane, comprising the steps of:

(a) illuminating the optical system to produce resultant beams which strike the image plane of an interferometer mask;

(b) selectively masking the resultant beams;

(c) recording beam intensity images for the resultant beams that are transmitted through the mask;

(d) capturing of at least one beam within the image plane mask aperture of the interferometer;

(e) calculating the global fringe contrast parameter from Fast Fourier-transforms which are computed from the beam intensity images to thereby produce fine alignment information; and (f) moving at least one optical component to alter the position where the resultant beam intercepts the mask, said move being made substantially according to said alignment information.

10. An inspection method wherein an interferometer is used for viewing an appropriately-scaled pseudo-image of transmissive features of an interferometer mask, comprising the steps of:

(a) illuminating the optical system to produce a resultant reference beam which strikes the image plane of an interferometer mask;

(b) selectively masking the reference beam through a reference pinhole;

(c) recording beam intensity images for the resultant beam which is transmitted through the selective mask; and (d) calculating logarithmically-scaled magnitudes for the Fast Fourier-transforms which are computed from the beam intensity images to thereby produce an image in which transmissive features of the mask are seen magnified whereby the method can be used for microscopic viewing of a mask or optics used within the interferometer.

* * * * *